(12) United States Patent
Hoversten et al.

(10) Patent No.: US 11,757,410 B2
(45) Date of Patent: Sep. 12, 2023

(54) MULTI-STAGE PULSE SHAPING NETWORK

(71) Applicant: Eta Wireless, Inc., Cambridge, MA (US)

(72) Inventors: John R. Hoversten, Arlington, MA (US); Yevgeniy A. Tkachenko, Belmont, MA (US); Sri Harsh Pakala, Chandler, AZ (US); James Garrett, Windham, NH (US)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 17/216,919

(22) Filed: Mar. 30, 2021

(65) Prior Publication Data

US 2021/0288614 A1 Sep. 16, 2021

Related U.S. Application Data

(63) Continuation of application No. 16/369,667, filed on Mar. 29, 2019, now Pat. No. 10,992,265.

(51) Int. Cl.
*H03F 3/04* (2006.01)
*H03F 1/02* (2006.01)
(Continued)

(52) U.S. Cl.
CPC ............. *H03F 1/0216* (2013.01); *H03F 1/32* (2013.01); *H03F 3/19* (2013.01); *H03F 1/0211* (2013.01);
(Continued)

(58) Field of Classification Search
CPC . H03F 1/0216; H03F 1/32; H03F 3/19; H03F 1/0211; H03F 1/0244;
(Continued)

(56) References Cited

U.S. PATENT DOCUMENTS

| 6,658,053 | B1 | 12/2003 | Aiello et al. |
| 8,633,766 | B2 | 1/2014 | Khlat et al. |

(Continued)

OTHER PUBLICATIONS

International Search Report of the ISA dated Jun. 12, 2020 for International Application No. PCT/US2020/021976; 4 Pages.
(Continued)

*Primary Examiner* — Khanh V Nguyen
(74) *Attorney, Agent, or Firm* — DALY, CROWLEY, MOFFORD & DURKEE, LLP

(57) ABSTRACT

In a discrete supply modulation system, a circuit includes a multi-stage pulse shaping network (PSN) having a first PSN stage having an input configured to receive variable bias supply signals from a power management circuit (PMC) and having an output coupled to one or more second PSN stages with each of the one or more second PSN stages having an output configured to be coupled to a supply (or bias) terminal of a respective one of one or more radio frequency amplifiers. Such an arrangement is suitable for use with transmit systems in mobile handsets operating in accordance with 5$^{th}$ generation (5G) communications and other connectivity protocols such as 802.11 a/b/g/n/ac/ax/ad/ay and is suitable for use with multiple simultaneous transmit systems including multiple-input, multiple-output (MIMO), uplink carrier aggregation (ULCA) and beamforming.

11 Claims, 14 Drawing Sheets

(51) Int. Cl.
*H03F 3/19* (2006.01)
*H03F 1/32* (2006.01)

(52) U.S. Cl.
CPC ...... *H03F 1/0244* (2013.01); *H03F 2200/165* (2013.01); *H03F 2200/451* (2013.01)

(58) Field of Classification Search
CPC ......... H03F 2200/165; H03F 2200/451; H03F 3/245; H03F 3/04; H03F 2200/504
USPC ....................................................... 330/297
See application file for complete search history.

(56) References Cited

U.S. PATENT DOCUMENTS

| | | | | |
|---|---|---|---|---|
| 9,668,215 | B2* | 5/2017 | Balteanu | .................. H04B 1/40 |
| 10,038,461 | B2* | 7/2018 | Briffa | ....................... H04B 1/04 |
| 10,958,218 | B2* | 3/2021 | Gebeyehu | ............. H03F 1/0216 |
| 10,992,265 | B2 | 4/2021 | Hoversten et al. | |
| 2012/0163489 | A1 | 6/2012 | Ramakrishnan | |
| 2012/0269240 | A1 | 10/2012 | Balteanu et al. | |
| 2013/0207731 | A1 | 8/2013 | Balteanu | |
| 2014/0057684 | A1 | 2/2014 | Khlat | |
| 2014/0086301 | A1 | 3/2014 | Akhavan et al. | |
| 2015/0139362 | A1 | 5/2015 | Lee et al. | |
| 2016/0050629 | A1 | 2/2016 | Khesbak et al. | |
| 2016/0099686 | A1 | 4/2016 | Perreault et al. | |
| 2018/0241350 | A1 | 8/2018 | Leipold et al. | |
| 2018/0316311 | A1 | 11/2018 | Gebeyehu et al. | |
| 2018/0331659 | A1* | 11/2018 | Khesbak | ............... H03F 1/0266 |

OTHER PUBLICATIONS

Written Opinion of the ISA dated Jun. 12, 2020 for International Application No. PCT/US2020/021976; 6 Pages.
U.S. Non-Final Office Action dated Sep. 2, 2020 for U.S. Appl. No. 16/369,667; 12 Pages.
Response to U.S. Non-Final Office Action dated Sep. 2, 2021 for U.S. Appl. No. 16/369,667; Response filed Nov. 23, 2020; 12 Pages.
U.S. Notice of Allowance dated Mar. 3, 2021 for U.S. Appl. No. 16/369,667; 9 Pages.
International Preliminary Report on Patentability dated Oct. 14, 2021 for International Patent Application No. PCT/US2020/021976; 8 Pages.
Communication Pursuant to Rules 70(2) and 70a(2) EPC dated Jan. 3, 2023 for European Application No. 20784025.7; 1 page.
Extended European Search Report dated Dec. 9, 2022 for European Application No. 20784025.7; 38 pages.

* cited by examiner

MULTI-STAGE PULSE SHAPING NETWORK

CROSS REFERENCE TO RELATED APPLICATIONS

This application is a continuation of co-pending U.S. application Ser. No. 16/369,667, filed Mar. 29, 2019, the entire contents of which are hereby incorporated herein by reference.

FIELD

The subject matter disclosed herein relates generally to radio frequency (RF) circuits and more particularly to devices, systems, and techniques for use in operating supply modulation transmitters.

BACKGROUND

As is known in the art, a radio frequency (RF) transmitter is a device that produces RF signals. RF transmitters may be included, for example, as part of a radio communication system that uses electromagnetic waves (radio waves) to transmit information over a distance.

As is also known, in RF communications transmitters (such as those suitable for use in a mobile device such as a cell phone, for example), a trade-off must generally be made between energy efficiency and linearity. It would, therefore, be desirable to provide systems and techniques that allow a user to transmit data carrying RF signals with both high efficiency and high linearity.

SUMMARY

In accordance with the concepts, systems, devices and techniques described herein, in a supply modulation system, a circuit comprising:
a multi-stage first pulse shaping network (PSN) having a first PSN stage (e.g. a so-called Stage A) having an input configured to be coupled to a power management circuit (PMC) and having an output and one or more second PSN stages (e.g. one or more so-called Stage Bs) with each of the one or more second PSN stages having an input configured to be coupled to the output of the first PSN stage and having an output configured to be coupled to a supply terminal of a radio frequency (RF) amplifier.

With this particular arrangement, a circuit capable of controlling receive band noise and out of band emissions for supply modulation transmitters (i.e. both analog and digital supply modulation transmitters) while maintaining linearity and efficiency is provided. Furthermore, as will become apparent from the description herein below, circuits provided in accordance with the concepts and techniques described herein may also accommodate many RF amplifiers (e.g. RF power amplifiers) which are spaced apart (e.g. physically distant from) the PMC in a cost-effective mobile device form factor.

In embodiments, the first PSN stage comprises a passive LC filter.

In embodiments, the first PSN stage is implemented utilizing parasitic elements. For example, first PSN stage may be implemented utilizing parasitic inductance and/or capacitive and/or resistive characteristics of the PMC and/or the electrical signal path circuit providing an electrical connection between the first and second PSN stages (e.g. the signal path providing an electrical connection between a so-called A stage and one or more so-called B stages).

In accordance with a further aspect of the concepts, systems, devices and techniques described herein, in a supply modulation system, a reconfigurable filter circuit having first and second terminals includes two or more signal paths with each of the at least two or more signal paths comprising at least one reactive element and at least one of the two or more signal paths including a switch element configured to selectively couple at least one of the at least one reactive elements between a reference potential and at least one of the first and second terminals of the reconfigurable filter circuit.

With this particular arrangement, a reconfigurable filter circuit configured to provide a plurality of filter characteristics at a supply voltage terminal (i.e. a bias terminal) of an RF amplifier is provided. By placing switches in each of the two or more signal paths in open or closed positions, one of a plurality of different filtering characteristics over a predetermined RF frequency band may be provided. The switches may be operated independently to provide a desired filter characteristic. For example with N reconfigurable configurable signal paths (with N being an integer greater than or equal to 1 and corresponding to a number of switchable signal paths in the reconfigurable filter circuit), the reconfigurable filter circuit is capable of providing $2^N$ different filter characteristics. Thus, this arrangement enables selection of one of a plurality of desired filtering characteristics over a predetermined RF frequency band.

In embodiments, the filter characteristic provided by the reconfigurable filter circuit may be selected in response to a changing impedance of a load coupled to an RF output port of the RF amplifier to which the reconfigurable filter circuit is coupled. Thus, the reconfigurable filter circuit enables dynamic selection of one of a plurality of desired filtering characteristics over a predetermined RF frequency band.

In embodiments, at least one of the at least two or more signal paths comprises a switch element having a first terminal coupled to one of the reactive elements and a second terminal coupled to a reference potential.

By providing a switch element coupled between a reactive element and either a reference potential or one of the reconfigurable filter terminals, the impedance of characteristic of the reactive element can be switched into and out of the filter circuit (thus making the filter circuit reconfigurable). In one embodiment, by placing the switch in a first switch position (e.g. a closed position such that the switch provides a low impedance signal path between the reactive element and the reference potential), the reconfigurable filter circuit is provided having a first filter characteristic and by placing the switch in a second, different switch position (e.g. an open position such that the switch provides a high impedance signal path between the reactive element and the reference potential), the reconfigurable filter circuit is provided having a second, different filter characteristic.

In embodiments, at least one of the at least two or more signal paths comprises a switch element having a first terminal coupled to one of the first and second terminals of the reconfigurable filter circuit and a second terminal coupled to a first terminal of one of the reactive elements.

By providing a switch element coupled between one of the reconfigurable filter circuit terminals and a reactive element, the impedance of characteristic of the reactive element can be switched into and out of the filter circuit (thus making the filter circuit reconfigurable). In one embodiment, by placing the switch in a first switch position (e.g. a closed position such that the switch provides a low impedance signal path between the reactive element and one of the reconfigurable filter circuit terminals), the reconfigurable filter circuit is provided having a first filter characteristic and by placing the switch in a second, different switch position (e.g. an open position such that the switch provides a high impedance signal path between the reactive element and one of the reconfigurable filter circuit terminals), the reconfigurable filter circuit is provided having a second, different filter characteristic.

In embodiments, a second terminal of one of the reactive elements is coupled to a reference potential (e.g. ground).

In embodiments, the reactive elements may comprise one or more capacitive and/or inductive and/or resistive elements.

In embodiments, the switch element may comprise one or more of: a transistor (e.g. a field effect transistor); a diode; or any other circuit element capable of effectively electrically connecting or electrically disconnecting (or otherwise electrically isolating) one or more reactive elements from the reconfigurable filter circuit.

In embodiments, the reactive elements may comprise one or more elements having a capacitive impedance characteristic over a predetermined frequency range and/or one or more elements having an inductive impedance characteristic over a predetermined frequency range.

In embodiments, the reactive elements may comprise one or more capacitors and/or inductors.

In embodiments, the reconfigurable filter circuit may comprise one or more resistive elements coupled in series or in parallel with one or more capacitive and/or inductive elements.

The supply modulation system is applicable to any type of (analog or digital) supply modulation. In embodiments, the supply modulation system is provided as a discrete supply modulation system.

BRIEF DESCRIPTION OF THE DRAWINGS

The foregoing features may be more fully understood from the following description of the drawings in which.

DETAILED DESCRIPTION

Figure 1:
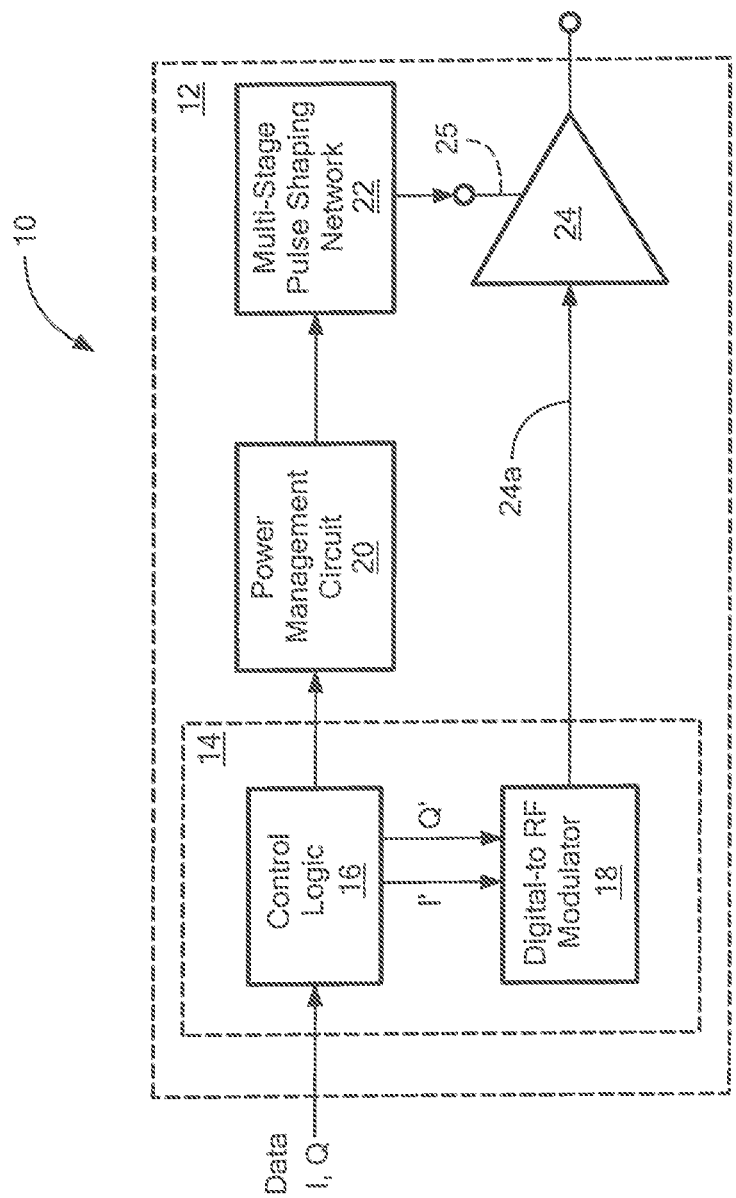
FIG. 1 is a block diagram of an illustrative embodiment of a radio frequency (RF) transmitter which includes a power management circuit (PMC) having a single output and a multi-stage (or split) pulse shaping network (PSN)

Referring now to FIG. 1, an illustrative radio frequency (RF) transmit system 10 capable of concurrently achieving both high efficiency and high linearity includes a discrete supply modulation system 12 which supplies a bias voltage signal to a bias (or supply) terminal 23 of a radio frequency amplifier 24.

Discrete supply modulation system 12 includes a controller 14 comprising control logic circuitry 16 (or more simply control logic 16). Control logic 16 may receive or otherwise acquire transmit data to be transmitted into a wireless channel. The transmit data may be in any format (e.g., a binary bit stream; I and Q data; etc.). Control logic 16 may then use this data, as well as other possible factors, to provide signals to a digital-to-RF modulator 18 which receives the signals provided thereto and generates a corresponding RF signal to be transmitted.

In some embodiments, the goal may be to generate an RF transmit signal that includes an accurate representation of the transmit data. Any of a number of different modulation and coding schemes (MCSs) may be used to represent the transmit data within the RF transmit signal. The MCS may include, for example, binary phase shift keying (BPSK), quadrature phase shift keying (QPSK), quadrature amplitude modulation (e.g., QAM, 16 QAM, 64 QAM, 128 QAM, etc.), orthogonal frequency division multiplexing (OFDM), and/or others. Some of these MCSs have relatively high peak to average power ratios.

MCSs having high peak to average power ratios typically require highly linear power amplification (e.g. via an RF power amplifier such as power amplifier 24 in FIG. 1) to provide an accurate representation of transmit data. In various embodiments described herein, transmission systems and techniques are described that are capable of providing efficient power amplification with sufficient linearity to support MCSs having high peak to average power ratios and/or having stringent error vector magnitude (EVM) requirements.

As shown in FIG. 1, control logic 16 acquires transmit data (e.g. I, Q data which may be a stream of data (i.e., transmit data) to be transmitted from RF transmitter 10) and uses the data to provide input information to the digital-to-RF modulator 18 and to a power management circuit 20. In one possible approach, control logic 16 may provide separate I and Q data to the digital to RF modulator. The digital-to-RF modulator may then use the I, Q information to modulate an RF carrier wave to generate a corresponding RF signal at an output thereof. As is well known, I and Q data is generally representative of an amplitude and a phase. Thus, I and Q may, for example, have a corresponding amplitude A and phase θ.

The RF signal output by the digital-to-RF modulator in response to data provided thereto (e.g. I and Q data) may, therefore, be an RF signal having amplitude A and phase θ. In some implementations, the input information provided to the digital-to-RF modulator may be in a format other than I and Q. For example, in one possible approach, amplitude and phase (A, θ) information may be delivered to the digital-to-RF modulator by controller 14. As described above, the input information applied to the digital-to-RF modulator may change on a sample by sample basis in some embodiments.

Regardless of the format in which digital-to-RF modulator 18 receives data provided thereto, the digital-to-RF modulator 18 provides an RF signal to an input 24a of an RF amplifier 24. One of ordinary skill in the art will understand how to select the characteristics of RF amplifier 24 to suit the needs of a particular application. In some applications (e.g. mobile handset applications) RF amplifier 24 comprises an RF power amplifier. RF amplifier 24 receives the RF signal provided thereto and provides an amplified version of the RF signal at an output thereof. The output of RF amplifier 24 may be coupled to another RF circuit or to the input of an antenna, for example.

As noted above, power management circuit (PMC) receives the information (e.g. control signals) provided thereto from the control logic 16 and in response thereto provides variable supply bias voltages (i.e. bias voltage signals) to an RF amplifier 24 (e.g. an RF power amplifier). In embodiments, the variable supply bias voltages are provided in the form of pulses with each pulse having one of a discrete number of voltage levels. That is, the PMC provides one of a plurality of discrete bias voltages to the bias terminal of the RF amplifier. Such discrete voltage supply levels provided by the PMC may be predetermined or may be adapted over time based upon required average transmit power levels or other factors.

Transitions between pulses of different voltage levels (i.e. transitions from one voltage level to another) can give rise to undesired frequency components in the varying supply bias voltage signals V(t) (i.e. the bias voltage signals). Such variable supply bias voltages are provided to the bias (or supply) terminal 23 of the amplifier 24 through a multi-stage pulse shaping network (PSN) 22. The multi-stage PSN functions to filter out or otherwise remove undesirable frequency components in the bias voltage signal. Thus, a filtered bias voltage signal is provided to the supply terminal 25 of the RF amplifier 24.

As also noted above, PMC provide a variable supply bias voltage V(t) to the RF amplifier based upon a control signal from the control logic 16. The PMC may be configured to selectively supply one of a plurality of discrete voltages to the RF amplifier and may supply the discrete voltage to the RF amplifier via the PSN.

For reasons which will become apparent form the description provided hereinbelow, the multi-stage PSN comprises spaced-apart stages (i.e. stages which are physically spaced apart) which may, for example, comprise lossless filter elements, including inductors and capacitors, and may further include lossy elements, such as resistors and magnetic beads. The multi-stage PSN serves to provide shaping and/or bandwidth limitation of the voltage transitions between discrete voltage levels and may provide damping of oscillations that might otherwise occur. In embodiments, the multi-stage PSN may be selected to provide a desirable filter response characteristic.

Significantly, and as will also become apparent from the description provided hereinbelow, the multi-stage PSN is physically divided into multiple stages. This approach allows the multi-stage PSN to provide appropriately filtered bias signals to multiple amplifiers without reproducing components of all PSN sections with each additional amplifier. The multi-stage PSN 22 is provided having desirable stop band and rejection band frequency characteristics as well as desirable pass band frequency and rise time characteristics.

Such a multi-stage PSN arrangement is suitable for use with transmit systems in mobile handsets operating in accordance with a $5^{th}$ generation (5G) communications and other connectivity protocols such as 802.11 a/b/g/n/ac/ax/ad/ay. Such a multi-stage PSN arrangement is also suitable for use with 5G multiple-input, multiple-output (MIMO), uplink carrier aggregation (ULCA), and beamforming systems.

Figure 2:
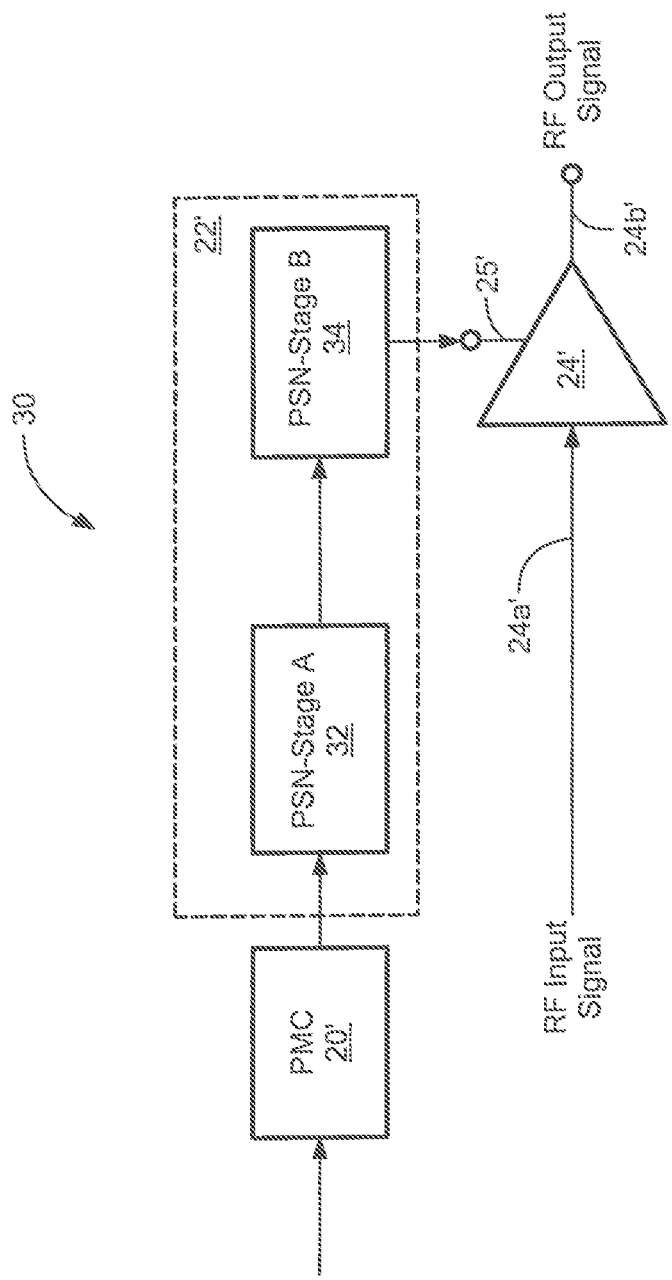
FIG. 2 is a block diagram of another illustrative embodiment of an RF transmitter which includes a single output PMC having a multi-stage (or split) PSN coupled thereto.

Referring now to FIG. 2, an RF transmit circuit 30 includes a PMC 20' (which may be the same as or similar to PMC 20 described above in conjunction with FIG. 1) having an input configured to receive information (e.g. control signals) provided thereto (e.g. from a controller such as controller 14 described above in conjunction with FIG. 1) and in response thereto provides variable supply bias voltages (e.g. bias signals having one of a plurality of discrete different voltage levels at a particular point in time) to an RF amplifier 24' having an RF input 24a', an RF output 24b' and a supply terminal 25'.

A variable supply bias voltage is provided to amplifier 24' through a multi-stage PSN 22', which may be the same as or similar to PSN 22 described above in conjunction with FIG. 1. In this illustrative embodiment, the multi-stage PSN 22' includes a first PSN stage 32 (and designated in FIG. 2 as "PSN—Stage A") and a second PSN stage 34 (and designated in FIG. 2 as "PSN—Stage B") which is physically separated from PSN stage A.

By physically dividing the PSN 22', into multiple stages, it is not necessary to reproduce components of the first PSN stage (i.e. Stage A in FIG. 2) in the second PSN stage (i.e. Stage B in FIG. 2). This approach results in the flexibility to place relatively large PSN components on a substrate (e.g. a printed circuit board (PCB)) in areas of the substrate better able to accommodate the larger circuit structures. That is, the multi-stage PSN approach allows PSN components which require an amount of area or volume (generally referred to as space or real estate) which is greater than the area or volume required by a majority of the other components which make up the PMC to be physically located in an area of a PCB which can accommodate such components. Furthermore, the multi-stage PSN approach allows the use of parasitic elements (e.g. parasitic inductance) which allows a reduction of size (and ideally elimination of) circuit components. This results in space savings and also in cost reduction for a PSN provided in accordance with the multi-stage PSN techniques described herein.

With this multi-stage PSN approach it is possible to control receive baseband (RxBN) and out of band emissions for discrete supply modulation transmitters while maintaining linearity and efficiency while also accommodating an amplifier (e.g. an RF PA) which is physically distant from the PMC on an IC or on a PCB or on any type of substrate in a cost-effective manner and which is suitable for a mobile device form factor.

In some embodiments, one or more RF amplifiers may be used to generate a transmit signal in an RF transmitter. For example, FIG. 3 is a block diagram illustrating an RF transmitter that includes a plurality of power amplifiers in accordance with an embodiment.

Figure 3:
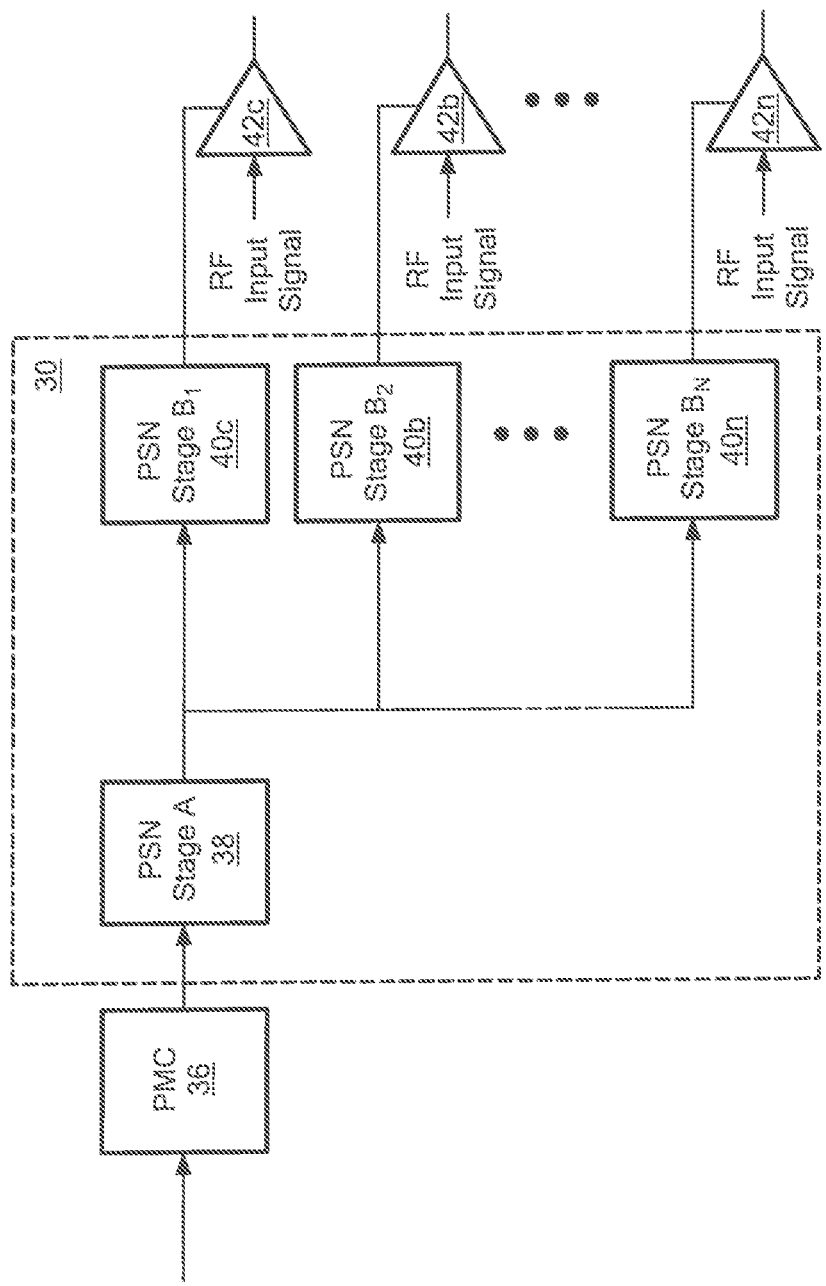
FIG. 3 is a block diagram of an illustrative RF transmitter having a single output PMC and an alternate embodiment of a multi-stage PSN coupled to a plurality of RF amplifiers.

Referring now to FIG. 3, a PMC 36 has an input configured to receive information (e.g. control signals) provided thereto (e.g. from a controller such as controller 14 described above in conjunction with FIG. 1) and in response thereto provides variable supply bias voltages to a plurality of RF amplifiers 42a-42n, based upon control signals from the controller. In embodiments, one or all of RF amplifiers 42 may correspond to RF PAs.

The variable supply bias voltages are provided to amplifiers 42a-42N through a multi-stage PSN 30. In this illustrative embodiment, the multi-stage PSN 30 includes a first PSN stage 38 (and designated in FIG. 3 as "PSN Stage A") and a plurality of second PSN stage 40a-40N (and designated in FIG. 3 as "PSN Stage B$_i$"). In this illustrative embodiment, the number of second PSN stages 40 matches the number of amplifiers 42 (i.e. there is a 1:1 correspondence between the number of PSN second stages and the number of amplifiers receiving voltage supply signals through the PSN 30).

With this approach, it is possible to control RxBN and out of band emissions for discrete supply modulation transmitters while maintaining linearity and efficiency while also accommodating a plurality of RF amplifiers 42 which are physically distant from the PMC in a cost-effective manner suitable for a mobile device form factor.

Furthermore, the characteristics of each second PSN stage 40 may be matched to the characteristics of the RF amplifier to which the PSN is coupled. It should, of course, be appreciated that in other embodiments, a single second PSN stage may be coupled to multiple RF amplifiers 40.

By physically dividing the multi-stage PSN it is not necessary to reproduce components of the first PSN stage (i.e. Stage A) for each amplifier. Thus, multi-stage PSN serves multiple amplifiers 42a-42N while only having multiple second stages. Since it is not necessary to repeat the entire PSN for each amplifier, this approach saves real estate on a PCB (or similarly, the size of a PCB required to accommodate a PMC, PSN and amplifier (and related circuits) may be reduced).

Thus, with this multi-stage PSN approach, it is possible to control receive baseband (RxBN) and out of band emissions for discrete supply modulation transmitters while maintaining linearity and efficiency while also accommodating a plurality of RF amplifiers (e.g. RF Pas) which are physically distant from the PMC in a cost-effective manner suitable for a mobile device form factor.

Figure 4:
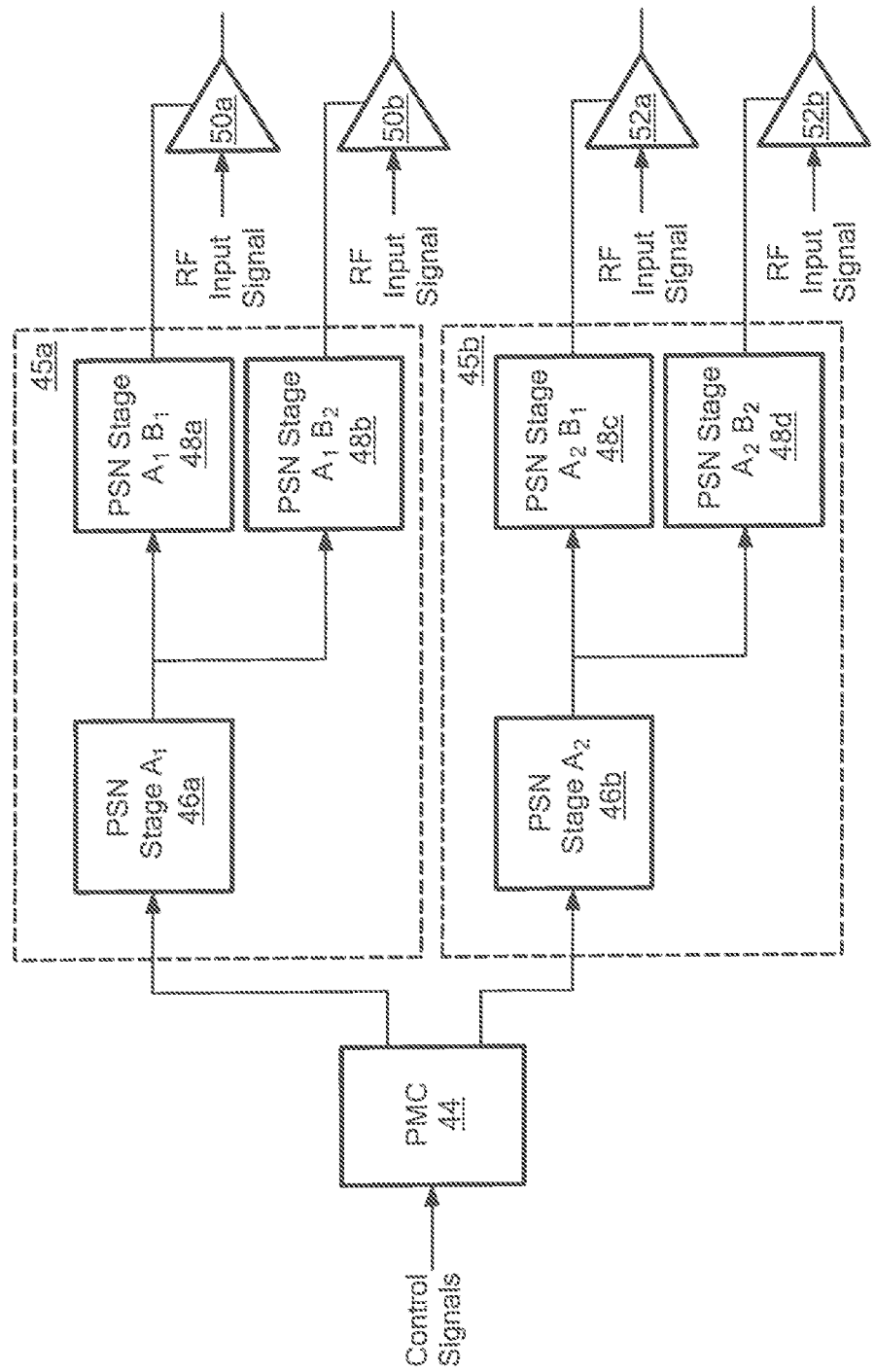
FIG. 4 is a block diagram of an illustrative RF transmitter having a multi-output PMC and an alternate embodiment of a multi-stage PSN coupled to a plurality of RF amplifiers.

Referring now to FIG. 4, a portion of a transmit circuit includes a PMC 44 having an input configured to receive control signals (e.g. from a control logic circuit such as control logic circuit 16 described above in conjunction with FIG. 1). PMC 44 has a plurality of outputs (i.e. PMC 44 is a multi-output PMC). In this illustrative embodiment, to promote clarity in the text and drawings, PMC 44 is illustrated as a dual output PMC. Those of ordinary skill in the art will appreciate, of course, recognize that PMC 44 may have any number of outputs and that the particular number of outputs with which to provide PMC 44 is selected in accordance with a variety of factors including, but not limited to the number of amplifiers which receive signals from PMC 44 and the needs of a particular application.

In this illustrative embodiment, each output 44a, 44b of PMC 44 is coupled to a respective first PSN stage 46a, 46b. An output of each first PSN stage 46a, 46b is coupled to corresponding ones of second PSN stages 48a, 48b, 48c, 48d. The outputs of second PSN stages 48a-48d are coupled to bias terminals of RF amplifiers 50a, 50b, 52a, 52b respectively.

Thus, FIG. 4 illustrates a transmit circuit comprising a plurality of, here four, RF amplifiers 50a, 50b, 52a, 52b and includes a PMC 44 which provides variable supply bias voltages (e.g. selected ones of a plurality of supply bias voltages in the case of supply modulation) to bias terminals of the amplifiers 50a, 50b, 52a, 52b via a bias supply signal path having respective ones of a pair of multi-stage PSNs 45a, 45b coupled thereto. In this illustrative embodiment, a first PSN 45a comprises a first PSN stage 46a (and designated in FIG. 4 as "PSN Stage A1") and a plurality of second PSN stages 48a, 48b (and designated in FIG. 4 as "PSN Stage A1B1" and "PSN Stage A1B2"). A second PSN 45b comprises a first PSN stage 46b (and designated in FIG. 4 as "PSN Stage A2") and a plurality of second PSN stages 48c, 48d (and designated in FIG. 4 as "PSN Stage A2B1" and "PSN Stage A2B2").

It should be appreciated that the electrical characteristics of second PSN stages 48a, 48b are selected or configured to operate with the electrical characteristics of first PSN stage 46a and the respective RF amplifier to which the second stage is coupled while the electrical characteristics of second PSN stages 48c, 48d are selected or configured to operate with the electrical characteristics of first PSN stage 46b and the respective RF amplifier to which the second stage is coupled. Thus, while the characteristics of the first PSN stages A1, A2 may differ and the characteristics of the second first PSN stages A1B1, A1B2, A2B1, A2B2 may differ, the first and second stages cooperate to provide appropriate and desired filtering to the variable supply bias voltages provided to the amplifiers 50a, 50b, 52a, 52b.

In general, it is desirable to provide a PSN having at least one, or ideally all, of the following qualities/characteristics: a desired amount of signal attenuation in the receive band (i.e. obtaining a desirable amount of attenuation from input to output at a desired offset frequency); a desired unloaded voltage step response (i.e. in response to a voltage step at the input, obtaining a desired peak output voltage assuming the PSN is unloaded (i.e. PA is not biased)); a desired loaded voltage step response: (i.e. in response to a voltage step at the input obtaining a desired peak output voltage assuming the PSN is loaded (i.e. PA is biased); a desired AC output impedance (i.e. for a fixed input voltage, obtaining a desired output voltage variation in response to a varying AC load current at desired frequencies); a desired DC output impedance: (i.e. for a fixed input voltage, obtaining a desired output voltage variation in response to a DC load current); and a desired maximum inrush current (i.e. obtaining a desired peak current a PMIC must source to the PSN during a voltage step). A PSN having other qualities/characteristics may also be desirable.

It should be appreciated that, although in this illustrative embodiment, only two first stages and four second stages are shown, in other embodiments PMC may be coupled to more than two first stages and each first stage may be coupled to more than two second stage. In general, PMC may be provided having N outputs (where N is an integer greater than or equal to 1) and thus PMC may be coupled to at least as many as N first PSN stages and each of the N first PSN stages may be coupled to as many as M second stages (where M is an integer greater than or equal to 1). Furthermore, each of the second PSN stages may be coupled to P amplifiers (where P is an integer greater than or equal to 1).

Although in the illustrative embodiment described in FIG. 4, the number of second PSN stages 48 matches the number of amplifiers 50 (i.e. there is a 1:1 correspondence between the number of PSN second stages and the number of amplifiers receiving voltage supply signals through the PSN 30) in some embodiments, one or more of the second PSN stages may be coupled to more than one RF amplifiers.

Figure 5:
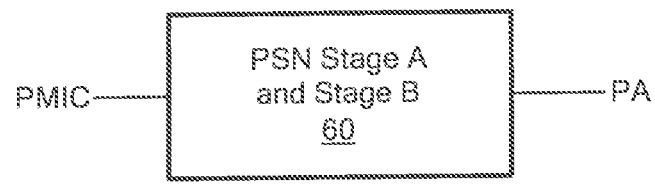
FIG. 5 is a block diagram of an illustrative embodiment of a multi-stage PSN.

Referring now to FIG. 5, a merged multistage PSN 60 includes merged stages Stage A and Stage B. Stages are comprised of series and shunt impedances formed using resistors, inductors, capacitors, and/or magnetic and/or ferrite beads. Depending upon system constraints several different types of stages can be used individually or cascaded together to meet requirements.

Figure 6:
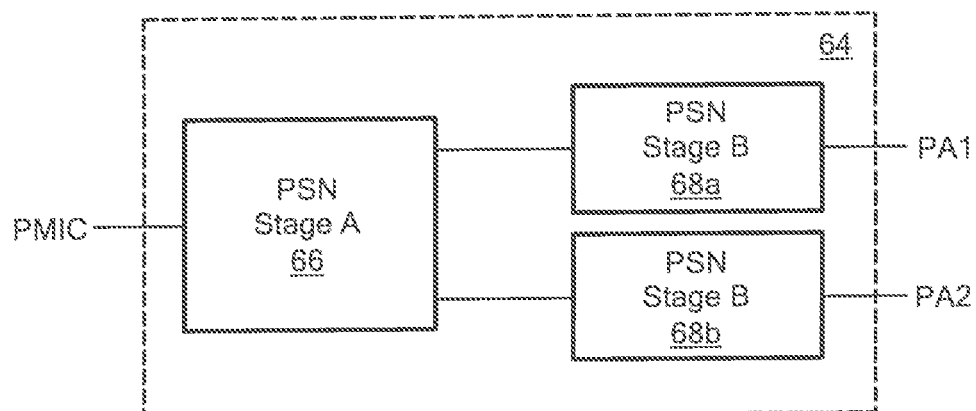
FIG. 6 is a block diagram of an alternate embodiment of a multi-stage PSN.

Referring now to FIG. 6, a multi-stage PSN 64 includes a first PSN stage 66 (and designated in FIG. 6 as "PSN Stage A") and a plurality of like second PSN stages 68a, 68b (with both stages designated in FIG. 6 as "PSN Stage B""). In this illustrative embodiment, second PSN stages 68a, 68b have the same or similar electrical characteristics and are configured to be coupled to RF amplifiers having like electrical characteristics. Of course, in embodiments in which RF amplifiers are not well-matched (e.g. the electrical characteristics of RF amplifiers 50a, 50b differ from each other), then the electrical characteristics of the second PSN stages (e.g. PSN stages 68a, 68b) will also differ from each other in a way which results in desired performance of the respective RF amplifiers coupled thereto (e.g. RF amplifiers 50a, 50b in FIG. 4).

Accordingly, in embodiments, the selection of electrical characteristics (and thus components) with which to provide a PSN stage depends upon the electrical characteristics of the PA to which the second PSN stage is coupled or about the requirements of the frequency band over which the PA operates.

It should be appreciated that the PMC and first PSN stage (e.g. PSN Stage A) can be located a significant distance from the second PSN stage (e.g. PSN Stage B and from an RF amplifier (e.g. a PA) receiving the variable supply bias voltages.

Figure 7:
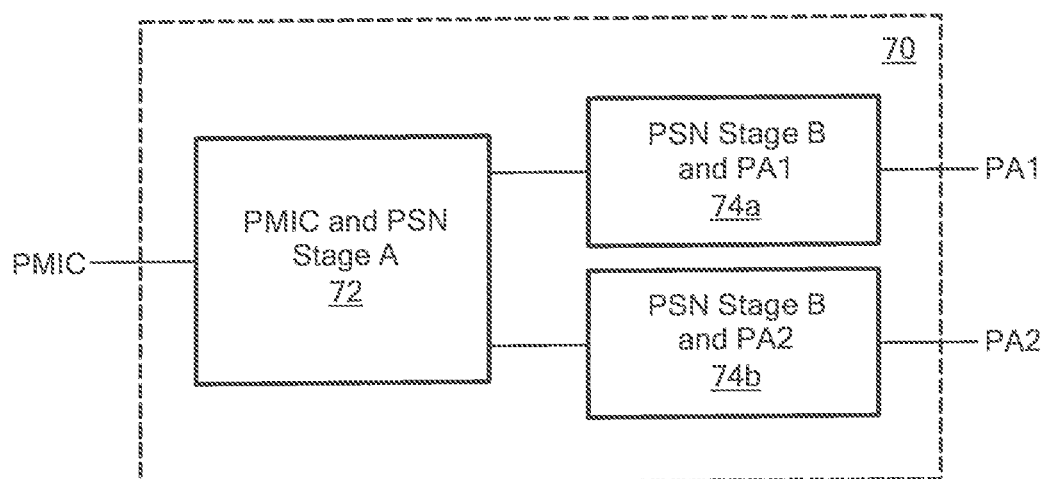
FIG. 7 is a block diagram of an alternate embodiment of a multi-stage PSN.

Referring now to FIG. 7, a portion of a transmit circuit 70 includes a first circuit corresponding to a power management circuit 72 provided as an integrated circuit (PMIC) having at least a portion of a first stage of a multi-stage PSN provided as part thereof (i.e. at least a portion of a first PSN stage is merged into the PMC circuit—e.g. by making use of parasitic elements associated with either the PMC and/or a signal path coupling the second PSN stage to the PMC). Thus, at least a portion of the first stage of the multi-stage PSN (and ideally the entire first stage of the multi-stage PSN) is merged (or integrated) with at least a portion of the PMC.

The circuit portion 70 further includes a pair of second circuits 74a, 74b corresponding to RF amplifiers (which may, for example, be RF power amplifiers) having at least portions of second stages of a multi-stage PSN integrated therewith (i.e. at least a portion of a second PSN stage is merged into each RF amplifier). As illustrated in FIG. 7, each of the second stages of the multi-stage PSN are integrated with at least portions of respective ones of one or more RF amplifiers (e.g. by making use of parasitic elements associated with either the RF amplifier and/or a signal path coupling the PSN second stage to the RF amplifier.

It should be noted that although only two RF amplifiers are shown in the illustrative embodiment of FIG. 7, any number of RF amplifiers may be used). It should also be noted that an integrated PMC and PSN Stage A can be located a significant distance from an integrated PSN Stage B and the RF amplifier. Thus, as illustrated and described, inductive and capacitances parasitic characteristics (sometimes referred to as parasitic elements) resultant from interconnect structures between Stages A and B (as well as structures within a PMC and an RF amplifier) can be designed into the overall impedance characteristics and/or response characteristics of a PSN.

In the illustrative embodiment shown in FIG. 7, the first and second stages of the PSN are absorbed (e.g. via the use of parasitic inductances and capacitances) into the respective PMC and RF amplifier circuitry (and hence, the filtering characteristics/functions performed by the PSN are likewise absorbed into the corresponding PMC and RF amplifier circuitry. Accordingly, the multi-stage PSN approach described herein leads to a module solution for both PMCs and PAs which can incorporate PSN stages to thereby further reduce the materials required to fabricate an RF transmit circuit as an IC.

Figure 8:
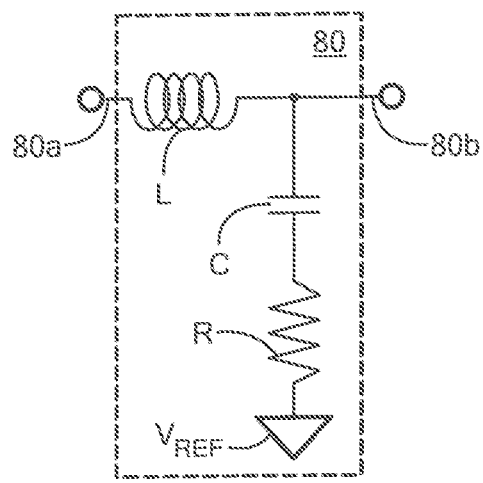
FIG. 8 is a schematic diagram of an illustrative filter circuit suitable for use with a multi-stage PSN having a leg with a shunt capacitor coupled in series with a resistive element between a filter terminal and a reference potential.
Figure 8A:
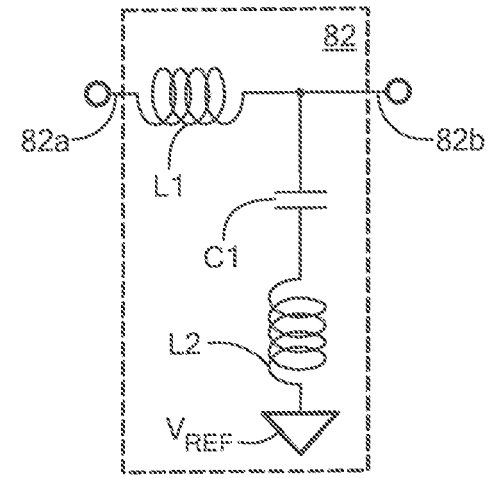
FIG. 8A is a schematic diagram of an illustrative filter circuit suitable for use with a multi-stage PSN having a leg with a shunt capacitor coupled in series with an inductive element between a filter terminal and a reference potential.
Figure 8B:
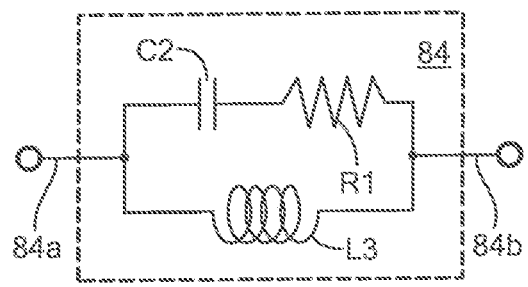
FIG. 8B is a schematic diagram of an illustrative filter circuit suitable for use with a multi-stage PSN having parallel inductive and capacitive paths coupled between the filter terminals.
Figure 8C:
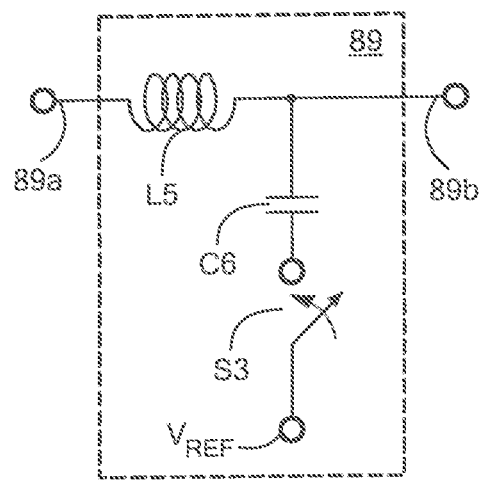
FIG. 8C is a schematic diagram of an illustrative filter circuit suitable for use with a multi-stage PSN having a shunt capacitor coupled in series with a switch between a filter terminal and a reference potential.
Figure 8D:
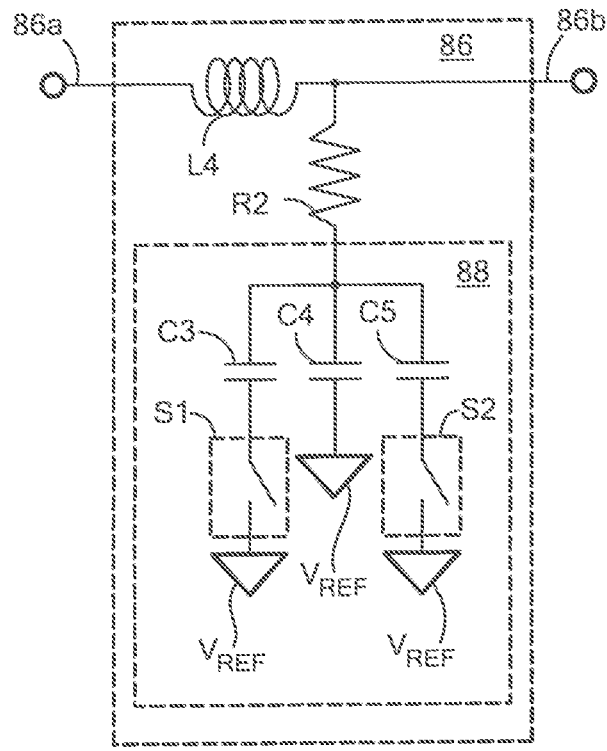
FIG. 8D is a schematic diagram of an illustrative filter circuit suitable for use with a multi-stage PSN having a shunt capacitor coupled in series with a switch between a filter terminal and a reference potential.
Figure 8E:
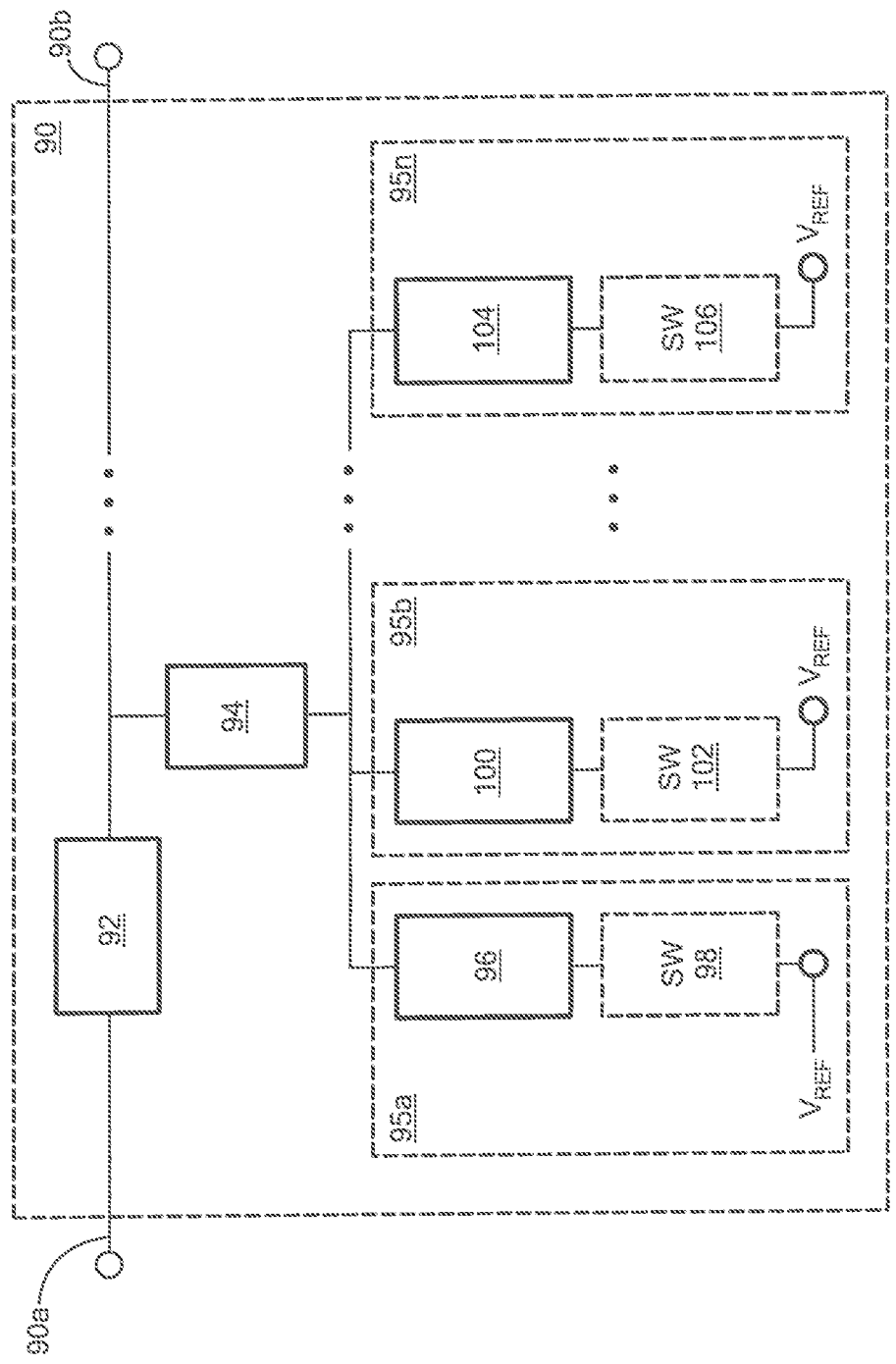
FIG. 8E is a block diagram of an illustrative PSN having.

Referring now to FIGS. 8-8E, a series of filter circuits suitable for use in the stages of a multi-stage PSN are shown. As will be described below in conjunction with FIGS. 8C, 8D and 8E, PSN stages can be made reconfigurable with switches to adjust electrical characteristics of a filter for different use cases.

Referring now to FIG. 8, a passive filter circuit 80 having first and second terminals 80a, 80b includes a series coupled inductor L (i.e. inductor L is serially coupled between terminals 80a, 80b of filter circuit 80). A first terminal of a capacitor C is coupled to a first one of first and second terminals of inductor L and a second terminal of capacitor C is coupled to a first terminal of a resistor R. A second terminal of resistor R is coupled to a reference potential (here illustrated as ground). After reading the disclosure provided herein, those of ordinary skill in the art will also appreciate that the reference potential $V_{REF}$ may correspond to ground or top some positive or negative potential (e.g. any positive or negative voltage). The particular reference potential $V_{REF}$ to use is selected to suit the needs of a particular application.

Referring now to FIG. 8A, a passive filter circuit 82 having first and second terminals 82a, 82b includes a series coupled inductor L1 (i.e. inductor L1 is serially coupled between terminals 82a, 82b of filter circuit 82). A first terminal of a capacitor C1 is coupled to a first one of first and second terminals of inductor L1 and a second terminal of capacitor C1 is coupled to a first terminal of a second inductor L2. A second terminal of inductor L2 is coupled to a reference potential $V_{REF}$.

Referring now to FIG. 8B, a passive filter circuit 84 includes a pair of signal paths coupled in parallel between first and second filter terminals 84a, 84b. A first one of the parallel signal paths includes an inductor L3 having a first terminal coupled to first filter terminal 84a and a second terminal coupled to second filter terminal 84b. A second one of the parallel signal paths includes a capacitor C2 having a first terminal coupled to the first filter terminal 84a and a second terminal coupled to a first terminal of a resistor R1. A second terminal of resistor R1 is coupled to the second filter terminal 84b.

Referring now to FIG. 8C, a reconfigurable filter circuit 89 having first and second terminals 89a, 89b includes a series coupled inductor L5 (i.e. inductor L5 is serially coupled between terminals 89a, 89b of filter circuit 89) and a shunt coupled capacitor C6. A first terminal of a capacitor C6 may be coupled to either the first or the second terminal of inductor L5. A second terminal of capacitive C6 is coupled to a reference potential $V_{REF}$ through a switch S3. Reconfigurable filter circuit 89 thus comprises at least one switchable signal path (i.e. a signal path comprising a switching element S3). In the illustrative embodiment of FIG. 8D, reconfigurable filter circuit 89 comprises a single switch coupled between a terminal of capacitor C6 and the reference potential $V_{REF}$. Those of ordinary skill in the art will appreciate, of course, that the positions of capacitor C6 and switch S3 can be reversed (i.e. a first terminal of switch S3 may be coupled to either the first or the second terminal of inductor L5 and a second terminal of switch S3 may be coupled to a first terminal of capacitor C6 while a second terminal of capacitor C6 is coupled to the reference potential $V_{REF}$). After reading the disclosure provided herein, those of ordinary skill in the art will also appreciate that the reference potential $V_{REF}$ may correspond to ground or some positive or negative potential (e.g. any positive or negative voltage). The particular reference potential $V_{REF}$ to use is selected to suit the needs of a particular application.

In practical systems, the switches may be switched between their "on" and "off" states on timescale consistent with the time required to make a determination of load impedance characteristics and/or performance characteristics of the RF amplifier and/or of performance characteristics of the RF transmit system taken over a period of time (and thus, this would be considered a relatively slow time scale when compared to the switching speed of a switch). In embodiments, the switches may be switched between their "on" and "off" states in response to average characteristics of any or all of: (1) load impedance characteristics; and/or (2) performance characteristics of the RF amplifier and/or (3) of performance characteristics of the RF transmit system. In some embodiments, the switches may be switched between their "on" and "off" states in response to substantially instantaneous impedance changes (i.e. the switch states may be changed as quickly as impedance changes can be identified) rather than on a slower timescale (i.e. slower relative to an instantaneous time scale) such as in response to average characteristics).

Referring now to FIG. 8D, a reconfigurable filter circuit 86 having first and second terminals 86a, 86b includes a series coupled inductor L4 (i.e. inductor L4 is serially coupled between terminals 86a, 86b of filter circuit 86). A first terminal of a resistor R2 is coupled to a first one of first and second terminals of inductor L4. A second terminal of resistor R2 is coupled to a variable capacitive network 88 capable of providing a variable capacitance. Variable capacitance network 88 comprises at least one switchable signal path (i.e. a switching path comprising a switching element). In the illustrative embodiment of FIG. 8C, variable capacitance network comprises three signal paths of which two are switchable signal paths. The switchable signal path (e.g. switchable elements S1, S2) may be switched in accordance with any of the techniques described above in conjunction with FIG. 8C.

In particular, network 88 includes one or more capacitors (with three capacitors being shown in this illustrative embodiment) coupled between a resistor and a reference potential (here the reference potential corresponding to ground). At least one capacitor in network 88 is coupled to a switch. The switch may be arranged (i.e. disposed on either side of the capacitor) such that the switch operates to make or break an electrical conduction between either the resistor and the capacitor or between the capacitor and a reference potential $V_{REF}$.

In this illustrative embodiment, a pair of switches S1, S2 are serially coupled between respective ones of capacitors C3, C5 and the reference potential. In response to a switch providing a low impedance signal path between a capacitor and the reference potential (i.e. in response to the switch being "closed"), a reconfigurable filter circuit 86 has a first filter characteristic. In response to a switch providing a high impedance signal path between the capacitor and the reference potential (i.e. in response to a switch being "open"), the reconfigurable filter circuit 86 has a second, different filter characteristic.

In general, each switchable signal path with 2 states (i.e. on and off) provides two different filter characteristics. In general, for N switchable signal paths each having 2 states, $2^N$ different filter characteristics are possible.

If an impedance of an RF load coupled to an output of an RF amplifier (e.g. RF amplifier 24 described above in conjunction with FIG. 1) changes or is continually varying, the operating characteristics of the RF amplifier will also change (i.e. a varying load impedance affects the operation and thus performance of the RF amplifier). By using a reconfigurable filter circuit, the filter and/or impedance characteristic of the reconfigurable filter circuit can be changed to achieve or maintain a desired performance by the RF amplifier (e.g. in response to varying RF load characteristics.

As noted above in conjunction with FIG. 8C, in practical systems, the switches may be switched between their "on" and "off" states on timescale consistent with the time required to make a determination of load impedance characteristics and/or performance characteristics of the RF amplifier and/or of performance characteristics of the RF transmit system taken over a period of time (and thus, this would be considered a relatively slow time scale when compared to the switching speed of a switch). In embodiments, the switches may be switched between their "on" and "off" states in response to average characteristics of any or all of: (1) load impedance characteristics; and/or (2) performance characteristics of the RF amplifier and/or (3) of performance characteristics of the RF transmit system. In some embodiments, the switches may be switched between their "on" and "off" states in response to substantially instantaneous impedance changes (i.e. the switch states may be changed as quickly as impedance changes can be identified) rather than on a slower timescale (i.e. slower relative to an instantaneous time scale) such as in response to average characteristics).

Although in the illustrative embodiment of FIG. 8D, the network 88 includes three parallel coupled capacitors with one capacitor coupled directly to a reference potential (here illustrated as ground) and two capacitors coupled to a reference potential (here illustrated as ground) through a switch, those of ordinary skill in the art will appreciate that reconfigurable filter circuit 86 may be provided from a wide range of other circuit implementations.

For example, and with reference now to FIG. 8E, a reconfigurable filter circuit 90 having first and second terminals 90a, 90b includes a plurality of impedance elements 92, 94 having a plurality of switched impedance elements 95a-95n coupled thereto. Each of the switched impedance elements 95a-95n includes at least one impedance element 96, 100, 104 which may comprise, for example, lossless elements, including inductors and capacitors, and may further include lossy elements, such as resistors and magnetic beads. The switched impedance elements 95a-95n also include one switch element 98, 102, 106 capable of switching at least a respective one of impedance elements 96, 100, 104 in a manner which changes the impedance presented by a PSN stage of which the reconfigurable filter circuit 90 is a part.

Figure 10:
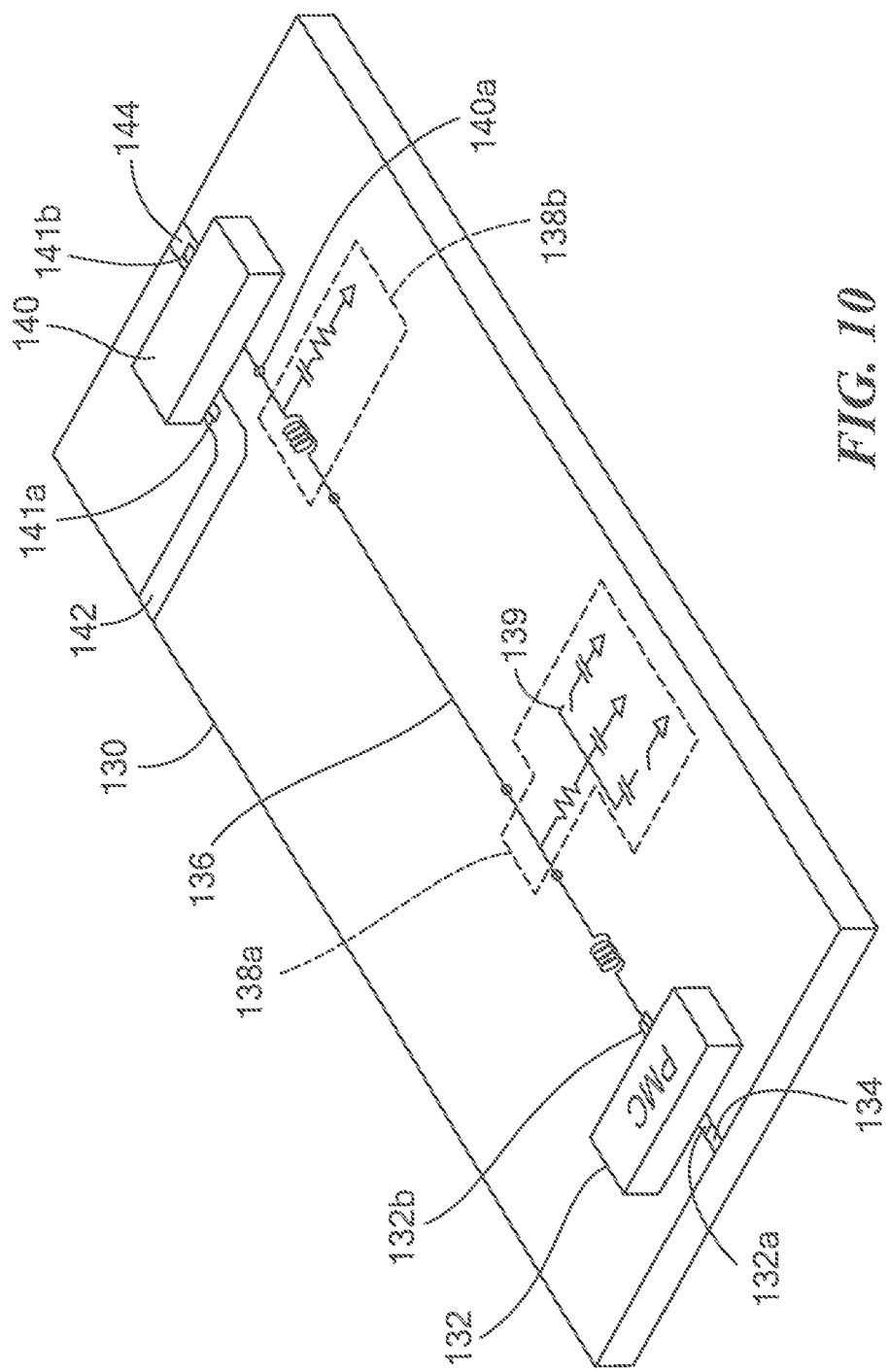
FIG. 10 is a block diagram of an illustrative hybrid circuit having a PMC coupled to a multi-stage PSN.
Figure 10A:
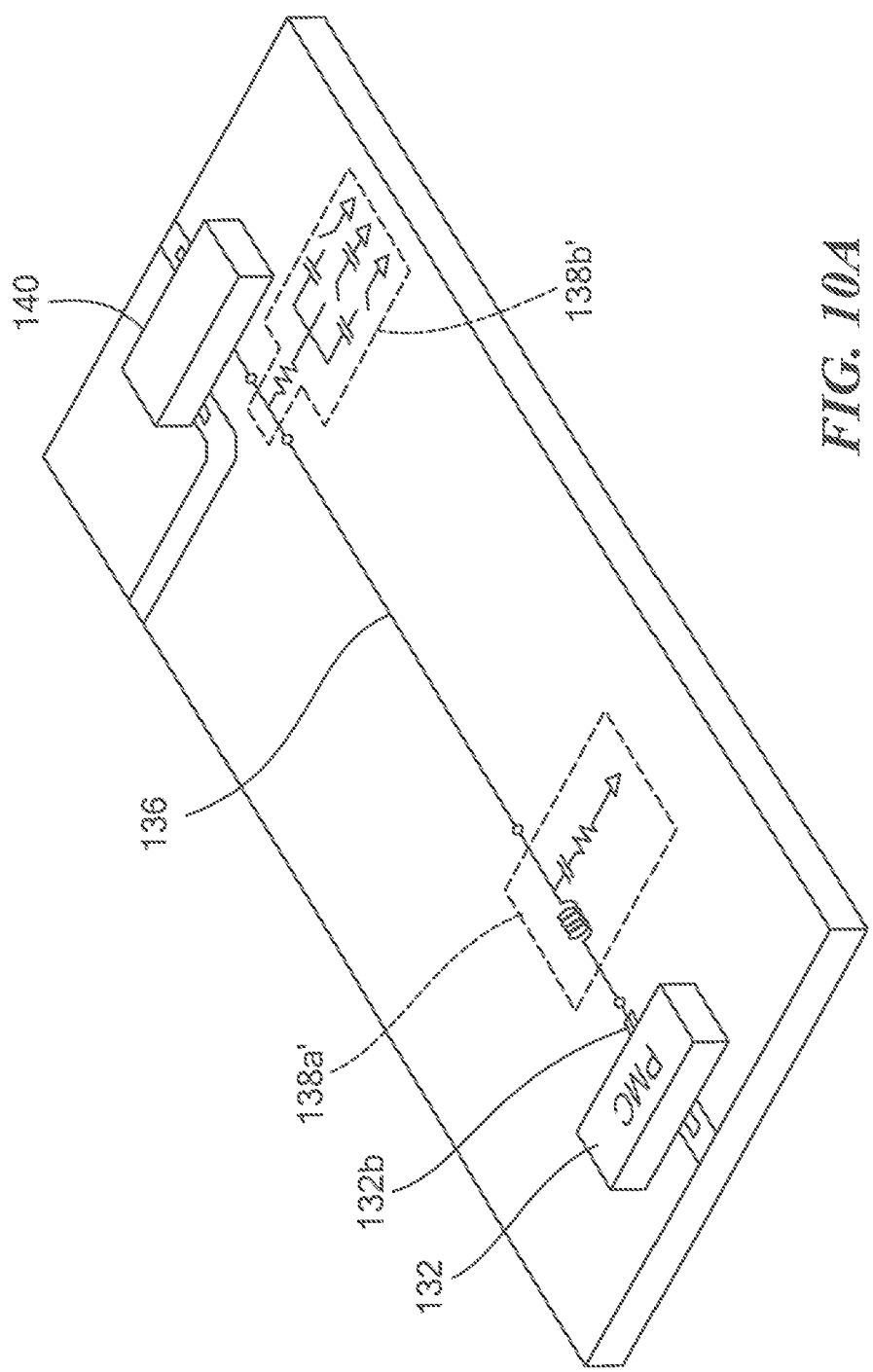
FIG. 10A is a block diagram of an alternate illustrative hybrid circuit having a PMC coupled to a multi-stage PSN.

It should be appreciated that, in general, at least one switch element is configured to selectively couple at least one reactive element between a reference potential and at least one of the first and second terminals of the reconfigurable filter circuit. For example, in embodiments, the positions of the reactive and switch elements (e.g. elements 96, 98 in FIG. 8D) may be reversed such that the switch element (e.g. switch element 98) has a first terminal coupled to one of the first and second filter terminals and a second terminal coupled to a first terminal of a reactive element (e.g. reactive element 96). A second terminal of the reactive element (e.g. reactive element 96) is coupled to a reference potential. An example of such a configuration is shown in FIGS. 10 and 10A.

It should further be understood that by placing switches in each of the two or more signal paths one of a plurality of different filtering characteristics over a predetermined RF frequency band can be provided. The switches may be operated independently to provide a desired filter characteristic. For example with N switchable signal paths (with N being an integer greater than or equal to 1), the reconfigurable filter circuit is capable of providing up to $2^N$ different filter characteristics.

In embodiments, at least one of the at least two or more signal paths comprises a switch element having a first terminal coupled to one of the first and second terminals of the reconfigurable filter circuit and a second terminal coupled to a first terminal of one of the reactive elements.

By providing a switch element coupled between one of the reconfigurable filter circuit terminals and a reactive element, the impedance of characteristic of the reactive element can be switched into and out of the filter circuit (thus making the filter circuit reconfigurable). In one embodiment, by placing the switch in a first switch position (e.g. a closed position such that the switch provides a low impedance signal path between the reactive element and one of the reconfigurable filter circuit terminals), the reconfigurable filter circuit is provided having a first filter characteristic and by placing the switch in a second, different switch position (e.g. an open position such that the switch provides a high impedance signal path between the reactive element and one of the reconfigurable filter circuit terminals), the reconfigurable filter circuit is provided having a second, different filter characteristic within the desired frequency band.

In embodiments, a second terminal of one of the reactive elements is coupled to a reference potential $V_{REF}$ (which may, for example, be ground).

Figure 9:
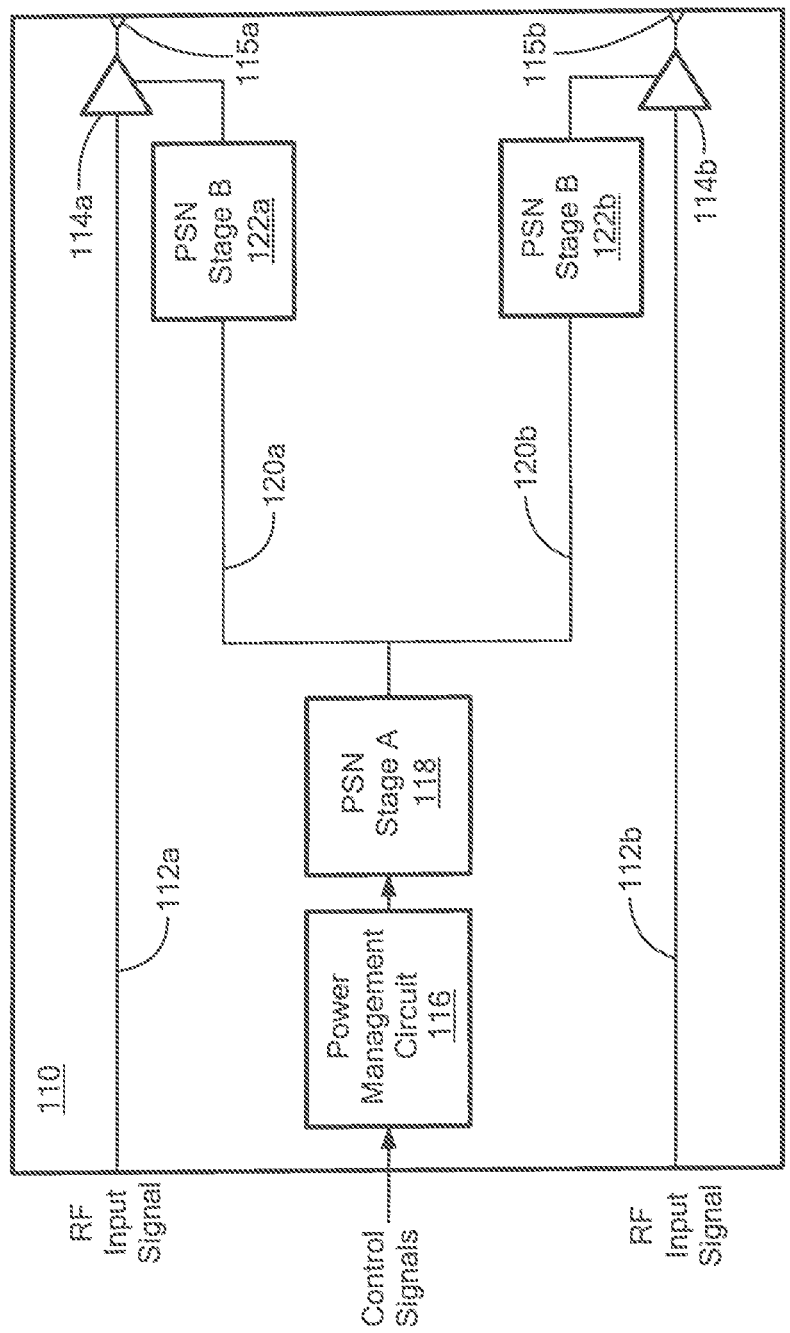
FIG. 9 is a block diagram of an illustrative integrated circuit (IC) having a split PSN.

Referring now to FIG. 9, a multiple-input, multiple-output (MIMO) transmit circuit implemented as an integrated circuit (i.e. a monolithic integrated circuit) 110 includes a pair of RF power amplifiers 114a, 114b having RF inputs to which RF signals are provided though signal paths 112a, 112b. Transmit circuit 110 further includes a PMC 116 (which may be functionally the same as or similar to any of the PMCs described above) having an input configured to receive information (e.g. control signals) provided thereto (e.g. from a controller such as controller 14 described above in conjunction with FIG. 1). In response to such control signals, PMC is configured to provide variable supply bias voltage signals though a first stage 118 of a PSN. First PSN stage 118 appropriately processes the signals (e.g. via a filtering or partial filtering operation) and provides appropriately processed supply bias voltage signals along signal paths 120a, 120b to respective ones of second PSN stages 122a, 122b. Second PSN stages 122a, 122b further process the signals provide thereto (e.g. via a filtering or partial filtering operations) and provides appropriately processed (e.g. appropriately filtered) supply bias voltage signals to supply terminals of respective ones of RF amplifiers 114a, 114b.

As noted above, the respective RF amplifiers 114a, 114b, receive RF signals along respect RF signal paths 112a, 112b, amplify the signals and provide the amplified RF signals to respective ones of antennas 115a, 115b through which an RF transmit signal is emitted.

It should be noted that PMC 116 and PSN Stage A 118 are located a significant distance from PSN Stages B 122a, 122b and the associated PAs 114a, 114b. In the illustrative embodiment of FIG. 9, PMC 116 and Stage A 118 are located at one end of IC 110 while Stages B 122a, 122b and the associated PAs 114a, 114b are located at substantially the opposite end of IC 110.

As noted above, by physically dividing the PSN into multiple stages (here two stages comprised of first stage 118 and second stages 122a, 122b), it is not necessary to reproduce components of the first PSN stage (i.e. Stage A). This approach reduces the amount of are a required on the IC to accommodate the PSN and affords the flexibility to place relatively large PSN components (i.e. PSN components which require a relatively large amount of real estate on an integrated circuit (IC)) in areas of the IC better able to accommodate the larger circuit structures.

Furthermore, with this multi-stage PSN approach, it is possible to control receive baseband (RxBN) and out of band emissions for discrete supply modulation transmitters while maintaining linearity and efficiency while also accommodating a plurality of RF amplifiers (e.g. a plurality of RF PAs) which are physically distant from the PMC on an IC in a cost-effective manner and which is suitable for a mobile device form factor.

It should be appreciated that although the embodiment of FIG. 9 is here illustrated as an integrated circuit, the circuit may also be implemented using a mixture of (i.e. a combination of) discrete circuit elements and integrated circuits. Examples of such embodiments are described hereinbelow in conjunction with FIGS. 10-11.

Figure 9A:
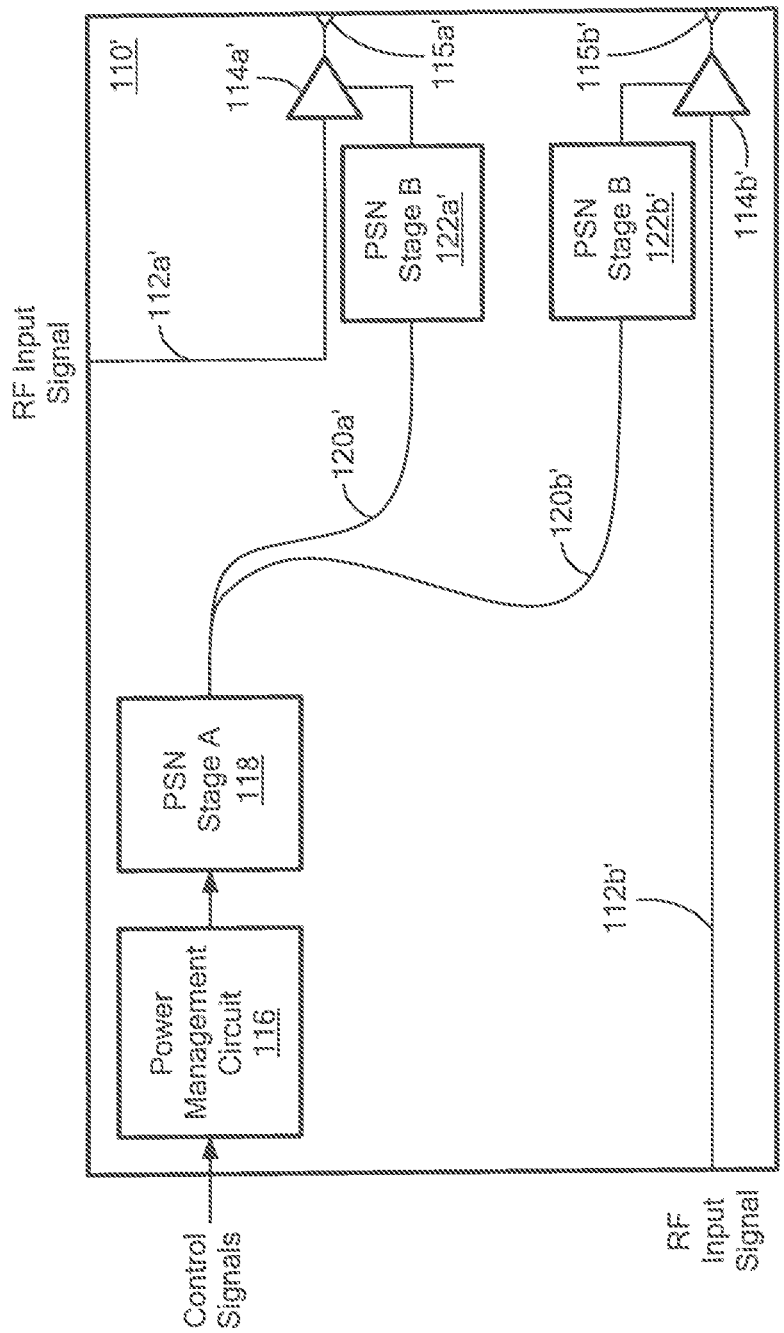
FIG. 9A is a block diagram of an illustrative IC having a split PSN.

Referring now to FIG. 9A, in which like elements of FIG. 9 are provided having like reference designations, a transmit circuit implemented as an integrated circuit 110' includes curved signal paths 120a', 120b'. In some embodiments it may be desirable or even necessary (e.g. due to circuit layout constraints or other factors) to include relatively long signal paths having curves or other non-straight line shapes. Signal paths having lengths which give rise to parasitic inductances and/or capacitances and/or resistances (sometimes simply referred to as "parasitics") are sometimes referred to as "long" signal paths. Long signal paths having curves or other shapes may particularly give rise to parasitic inductances and/or capacitances and/or resistances. The effect of such parasitics may be further increased or enhanced when long signal paths exist and even further increased when long curved signal paths exist.

As noted above PMC 116 and Stage A 118 are located a significant distance from Stages B 122a', 122b' and the associated PAs 114a, 114b. In the illustrative embodiment of FIG. 9A, PMC 116 and Stage A 118 are located at one end of IC 110' while Stages B 122a', 122b' and the associated PAs 114a', 114b' are located at substantially the opposite end of IC 110. Thus, the length of signal paths 122a', 122b' is significant and parasitics may arise due to the shape and/or physical length of the signal path between the first and second PSN stages. As noted above, such parasitic inductances and/or capacitances may be used in the design of PSN stages such as the first and/or second PSN stages.

Thus, in this embodiment, the impedance characteristics of the first PSN stage 118 and/or second PSN stages 122a', 122b' may incorporate the parasitics which arise due to one or both of signal paths 122a', 122b'.

Referring now to FIG. 10, substrate 130 has disposed thereon a PMC 132 which may be the same as or similar to any of the PMC's described hereinabove. In embodiments, the substrate may be provided as a printed circuit board (PCB) provided from any suitable single or multilayer dielectric material (e.g. a glass fiber reinforced epoxy resin based material or low temperature or a low temperature co-fired ceramic (LTCC) material with conductive layers provided therein or on exposed surfaces thereof).

In the illustrative embodiment of FIG. 10, the PMC is implemented as an integrated circuit disposed in an IC package, which may be, for example, a leadframe package, a substrate package, a wafer-level package or any other type of IC package known to those of ordinary skill in the art.

The PMC includes an input 132a coupled to an input signal path 134 provided on the PCB (e.g. the signal path is etched or otherwise provided as part of the PCB using additive or subtractive processes as is generally known). PMC input 132a is configured to receive control signals from a controller (such as controller 14 described herein above in conjunction with FIG. 1). PMC 132 also includes an output 132b coupled to a supply bias voltage signal path 136. Signal path 136 may be etched or otherwise provided as part of the PCB using any additive or subtractive process known to those of ordinary skill in the art. Supply bias voltages are provided at PMC output 132b as discussed hereinabove.

A first stage 138a of a PSN 138 is coupled to the supply voltage signal path. The first PSN stage may be implemented using discrete elements electrically coupled to each other and to the supply voltage signal path. A second stage of the PSN is coupled to the supply voltage signal path. The second PSN stage may be implemented using discrete elements electrically coupled to each other and to the supply voltage signal path. Thus, the circuit of FIG. 10 represents a hybrid circuit implementation which may include both integrated circuits (e.g. PMC and RF amplifier) as well as discrete elements (e.g. the first and second PSN stages).

In embodiments, the first PSN stage is physically proximate the PMC. In embodiments (and as shown and described in conjunction with FIG. 11), the first PSN stage may be included as part of a PMC module (e.g. a single package which includes a PMC and the first stage PSN, regardless of the manner in which either the PMC or first PSN stage are implemented). In this illustrative embodiment, first PSN stage 138a comprises a reconfigurable filter circuit 139 which functions in a manner similar to the reconfigurable filter circuit 88 described above in conjunction with FIG. 8C.

Figure 11:
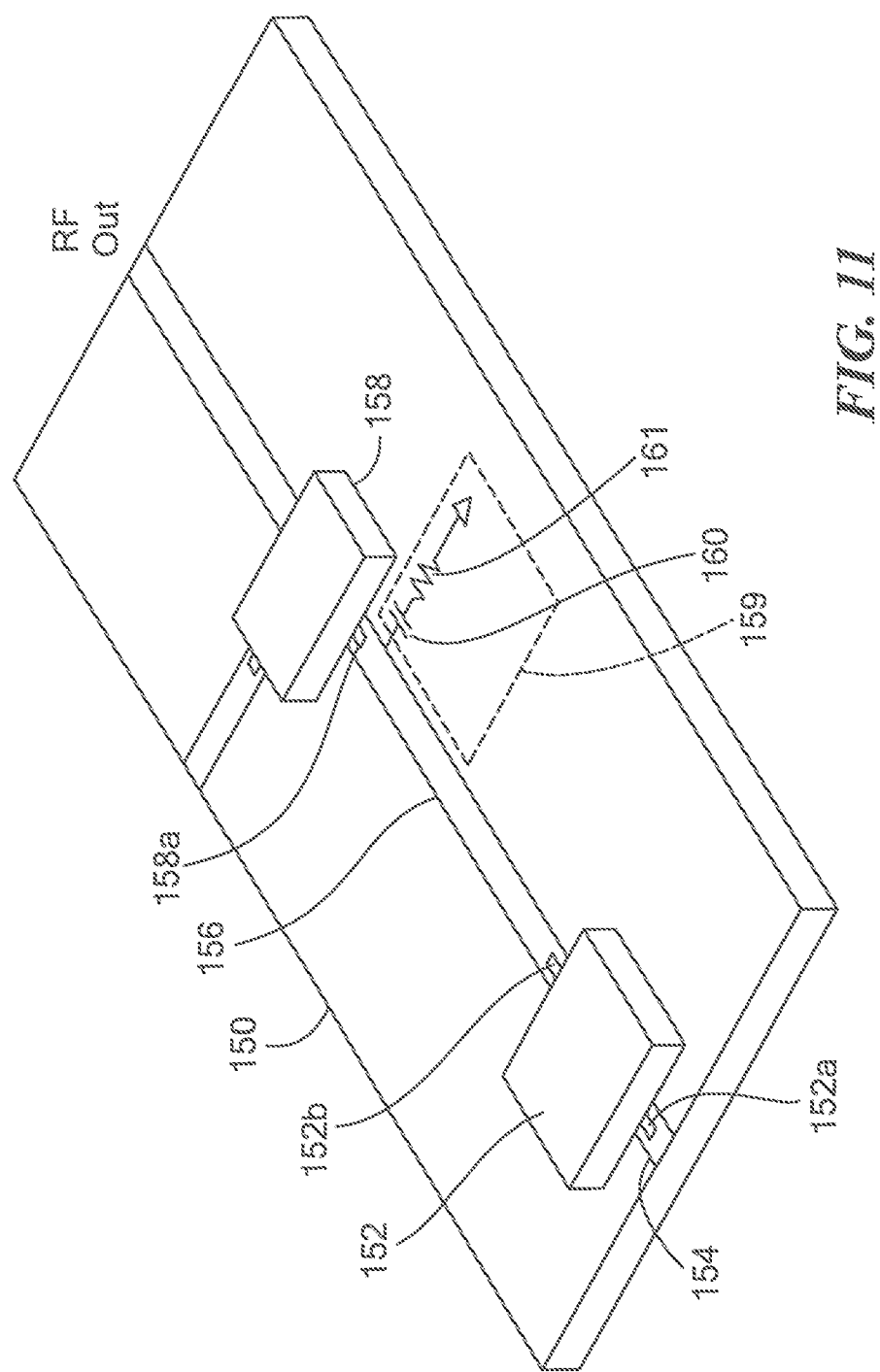
FIG. 11 is a block diagram of an illustrative circuit having a PMC module and an RF amplifier module with at least one of the modules comprising at least a portion of a multi-stage PSN.

In embodiments, the second PSN stage is physically proximate the amplifier bias terminal. In embodiments (and as shown in FIG. 11), second PSN stage may be included as part of an amplifier module (e.g. a single package which includes an RF amplifier and the second stage PSN). While the first PSN Stage 138a comprises active components (i.e. switches), the second PSN stage comprises only passive components and is implemented as circuit 80 described above in conjunction with FIG. 8.

The supply voltage signal path 136 is coupled to a supply terminal 140a (or bias terminal) of an RF amplifier 140 disposed on the PCB. Thus, supply voltage signals are provided from the PMC to the RF amplifier bias terminal through the supply voltage signal path 136.

The RF amplifier has an RF input 141a coupled to an RF input signal path 142 provided on the PCB and an RF output coupled to an RF output signal path 144 provided on the PCB. The RF amplifier may be the same as or similar to any of the RF amplifiers described herein above.

Referring now to FIG. 10A in which like elements of FIG. 10 are provided having like reference designations, in this illustrative embodiment, the first PSN stage 138a' comprises all passive components while the second PSN stage 138b' comprises active components (i.e. the switches).

It should be further understood that in some applications, it may be desirable to provide both the first and second PSN stages having all passive components. In still other applications, it may be desirable to provide both the first and second PSN stages having at least one active component (e.g. at least one switchable element such as a switch comprising a transistor or a diode).

Referring now to FIG. 11, a substrate 150 (which may be any of the types described above in conjunction with FIGS. 9-10A) has disposed thereon a PMC module 152. PMC module 152 comprises a PMC and the first PSN stage (i.e. the PMC module is a single package which includes a PMC and at least a portion of a first PSN stage regardless of the manner in which either the PMC or first PSN stage are implemented). In embodiments one or both or portions of either of the PMC and first PSN stage may be implemented as integrated circuits or may be implemented using discrete elements (i.e. discrete circuit components).

The PMC module 152 includes an input 152a coupled to an input signal path 154 provided on the PCB (e.g. the signal path is etched or otherwise provided as part of the PCB using additive or subtractive processes as is generally know) and configured to receive control signals from a controller (such as controller 14 described herein above in conjunction with FIG. 1). The PMC module also includes an output 152b coupled to a supply voltage signal path 156 (e.g. signal path is etched or otherwise provided as part of the PCB using additive or subtractive processes as is generally know) and at which supply bias voltages are provided as discussed hereinabove.

Also disposed on the substrate is an RF amplifier module 158 comprising an RF amplifier and a portion of a second PSN stage (i.e. a single package which includes an RF amplifier and at least a portion of the second PSN stage regardless of the manner in which either the RF amplifier or second PSN stage are implemented).

In the illustrative embodiment of FIG. 11, a first portion 159 of a second PSN stage comprises a capacitor 160 and inductor 161 serially coupled between supply voltage signal path 156 and a reference potential (here illustrated as ground) second PSN stage portion 159 is coupled proximate bias terminal 158a of RF amplifier module 158. A second portion of the second PSN stage is provided as part of the RF amplifier module and thus is not visible in FIG. 11.

It should be appreciated that in embodiments, the entire second PSN stage may be provided as part of the switch module. In embodiments, one or both of the RF amplifier and the second PSN stage (including all or portions of the second PSN stage) may be implemented as integrated circuits or may be implemented using discrete elements (i.e. discrete circuit components).

Figure 11A:
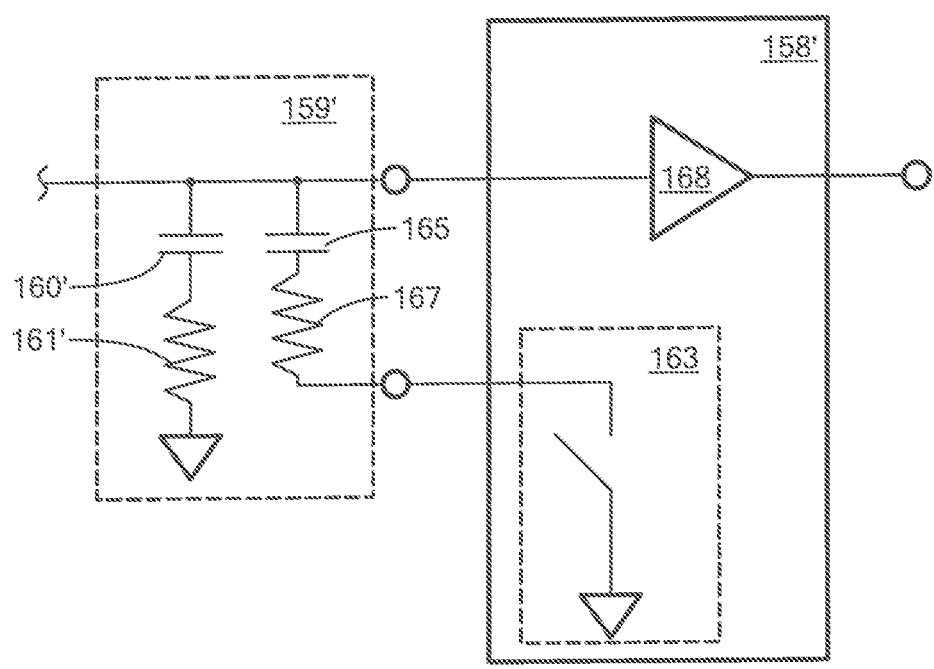
FIG. 11A is a schematic diagram of a portion of an RF amplifier module comprising a portion of a multi-stage PSN.

As may be more clearly understood from FIG. 11A, in embodiments an RF amplifier module 158' includes a switch which, together with capacitor 165 and resistor 167 form a switchable signal path portion of a second PSN stage 159'. Thus, in this embodiment, second PSN Stage 159' comprises capacitor 160' and a switchable signal path portion comprising capacitor 165, resistor 167 and switch 163 and a portion of the second PSN stage is realized as (i.e. is implemented as part of) the switch module.

It should thus also be appreciated that a similar approach may be used with the first PSN stage. That is, in embodiments in which the first PSN stage comprises, switches, all of some of the one or more switches may be realized as (i.e. implemented as part of) the PMC module.

It should also be appreciated that the supply voltage signal path (e.g. path 136 in FIGS. 10, 10A or path 156 in FIG. 11) may have the impedance characteristics of an inductor (i.e. the supply voltage signal path may electrically appear as a distributed inductive element). Thus, any inductive characteristics of the supply voltage signal path may be absorbed or at least taken into account in the component selection for the first and second PSN stages.

In the description above, various concepts, circuits, and techniques are discussed in the context of discrete supply modulation system for use with RF transmitters that are operative for transmitting signals via a wireless medium. The concepts, circuits and techniques described herein are appropriate for use in handsets (e.g. mobile handsets) operating in accordance with 5G communication protocols and other connectivity protocols such as 802.11 a/b/g/n/ac/ax/ad/ay and are also appropriate for use in multi-transmitter applications including, but not limited to, MIMO, uplink carrier aggregation (ULCA), and beamforming applications. It should be appreciated that these concepts, circuits, and techniques also have application in other contexts. For example, in some implementations, features described herein may be implemented within transmitters or drivers for use in wireline communication. In some other implementations, features described herein may be implemented within other types of systems that require highly efficient and highly linear power amplification for data carrying signals.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A multi-stage pulse shaping network configured to be coupled to a bias terminal of a radio frequency (RF) amplifier and configured for use in a discrete supply modulation system, the multi-stage pulse shaping network comprising:
   (a) a first pulse shaping network (PSN) stage having an input configured to be coupled to a power management circuit (PMC) and having an output;
   (b) one or more second PSN stages, each of the one or more second PSN stages physically spaced apart and distant from the first PSN stage and each of the second PSN stages having an input configured to be coupled to the output of the first PSN stage and having an output configured to be coupled to a bias terminal of an RF amplifier; and
   (c) a signal path having a first end coupled to the output of the first PSN stage and having a second end coupled to the inputs of the one or more second PSN stages, wherein the first PSN stage together with the one or more second PSN stages are configured to filter signals resultant from transitions between discrete voltage levels received from the PMC.

2. The multi-stage pulse shaping network of claim 1 wherein the first PSN stage comprises a passive LC filter.

3. The multi-stage pulse shaping network of claim 1 wherein the first PSN stage is implemented utilizing parasitic inductance and/or capacitive characteristics and/or resistive characteristics of at least one of:
   (a) the PMC; or
   (b) the signal path coupled between the output of the first PSN stage and the input of the second PSN stage.

4. The multi-stage pulse shaping network of claim 1 wherein the first PSN stage is implemented utilizing parasitic inductance and/or capacitive characteristics and/or resistive characteristics of at least:
   (a) the PMC;
   (b) the signal path coupled between the output of the first PSN stage and the input of the second PSN stage;
   (c) an RF amplifier; and
   (d) passives components comprising the PSN.

5. The multi-stage pulse shaping network of claim 1 wherein at least one of the first PSN stage and the second PSN stage comprises a reconfigurable filter circuit.

6. The multi-stage pulse shaping network of claim 1 wherein the PSN comprises a plurality of second PSN stages, each of the second PSN stages spaced apart and distant from the first PSN stage and each of the second PSN stages having an input configured to be coupled to the output of the first PSN stage and having an output configured to be coupled to a supply terminal of a corresponding one of a plurality of RF amplifiers.

7. The multi-stage pulse shaping network of claim 1 wherein at least one PSN stage is physically located proximate a PMC and at least one PSN stage is physically located proximate an RF amplifier.

8. The multi-stage pulse shaping network of claim 1 wherein at least one PSN stage is provided entirely from parasitics from one of: (1) parasitics from a PMC; (2) parasitics from the signal path which electrically couples the first stage to the second stage; (3) parasitics from a signal path which electrically couples at least one stage to an RF amplifier; and (4) parasitics from an RF amplifier.

9. The multi-stage pulse shaping network of claim 1 wherein the first PSN stage is a first one of a plurality of first PSN stages and the multi-stage pulse shaping network circuit further comprises a plurality of second PSN stages with each of the second PSN stages coupled to one or more first PSN stages.

10. The multi-stage pulse shaping network of claim 1 wherein the first PSN stage is a first one of a plurality of first PSN stages and the multi-stage pulse shaping network circuit further comprises a plurality of second PSN stages with each of the first PSN stages coupled to two or more second PSN stages.

11. The multi-stage pulse shaping network of claim 1 wherein filtering signals resultant from transitions between discrete voltage levels received from the PMC comprises damping oscillations.

* * * * *